US011276684B2

(12) United States Patent
Chen et al.

(10) Patent No.: US 11,276,684 B2
(45) Date of Patent: Mar. 15, 2022

(54) RECESSED COMPOSITE CAPACITOR

(71) Applicant: Taiwan Semiconductor Manufacturing Co., Ltd., Hsin-Chu (TW)

(72) Inventors: Yi-Huan Chen, Hsin Chu (TW); Chien-Chih Chou, New Taipei (TW); Alexander Kalnitsky, San Francisco, CA (US); Kong-Beng Thei, Pao-Shan Village (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 34 days.

(21) Appl. No.: 16/579,661

(22) Filed: Sep. 23, 2019

(65) Prior Publication Data
US 2020/0381420 A1    Dec. 3, 2020

Related U.S. Application Data

(60) Provisional application No. 62/855,129, filed on May 31, 2019.

(51) Int. Cl.
| | |
|---|---|
| *H01L 27/088* | (2006.01) |
| *H01L 27/06* | (2006.01) |
| *H01L 29/66* | (2006.01) |
| *H01L 29/78* | (2006.01) |
| *H01L 49/02* | (2006.01) |
| *H01L 21/8234* | (2006.01) |
| *H01L 23/522* | (2006.01) |
| *H01L 21/762* | (2006.01) |

(52) U.S. Cl.
CPC .... *H01L 27/0629* (2013.01); *H01L 21/76224* (2013.01); *H01L 21/823431* (2013.01); *H01L 21/823481* (2013.01); *H01L 23/5223* (2013.01); *H01L 27/0886* (2013.01); *H01L 28/40* (2013.01); *H01L 29/66795* (2013.01); *H01L 29/785* (2013.01)

(58) Field of Classification Search
None
See application file for complete search history.

(56) References Cited

U.S. PATENT DOCUMENTS 6,297,524 B1   10/2001   Vathulya et al.
6,613,690 B1 *   9/2003   Chang ................. H01L 27/1087
                                                                                                                                           257/E21.019

(Continued)

FOREIGN PATENT DOCUMENTS

WO     2007126256 A1     11/2007

*Primary Examiner* — Ali Naraghi
(74) *Attorney, Agent, or Firm* — Eschweiler & Potashnik, LLC

(57) ABSTRACT

Some embodiments relate to an integrated circuit (IC) that includes a semiconductor substrate. A shallow trench isolation region downwardly extends into the frontside of the semiconductor substrate and is filled with dielectric material. A first capacitor plate and a second capacitor plate are disposed in the shallow trench isolation region. The first capacitor plate and the second capacitor plate have first and second sidewall structures, respectively, that are substantially parallel to one another and that are separated from one another by the dielectric material of the shallow trench isolation region.

20 Claims, 11 Drawing Sheets

(56) References Cited

U.S. PATENT DOCUMENTS

| | | |
|---|---|---|
| 2002/0053691 A1 | 5/2002 | Leung et al. |
| 2003/0132438 A1 | 7/2003 | Jang |
| 2003/0143322 A1* | 7/2003 | Ning .................. H01L 27/0805 |
| | | 427/79 |
| 2005/0012132 A1 | 1/2005 | Tu |
| 2006/0138517 A1 | 6/2006 | Choi et al. |
| 2008/0006866 A1 | 1/2008 | Lee |
| 2011/0298085 A1 | 12/2011 | Terletzki |
| 2012/0007175 A1 | 1/2012 | Kim et al. |
| 2012/0181658 A1* | 7/2012 | Mohammed .......... H01L 23/481 |
| | | 257/532 |
| 2014/0239363 A1 | 8/2014 | Pan et al. |
| 2016/0190143 A1 | 6/2016 | Chuang et al. |
| 2016/0379988 A1 | 12/2016 | Chuang et al. |
| 2018/0076277 A1 | 3/2018 | Hu et al. |
| 2018/0130869 A1 | 5/2018 | Hu et al. |
| 2019/0212319 A1* | 7/2019 | Voiron ............... G01N 33/4836 |
| 2021/0167009 A1* | 6/2021 | Marzaki ............. H01L 27/0805 |

* cited by examiner

RECESSED COMPOSITE CAPACITOR

REFERENCE TO RELATED APPLICATION

This Application claims the benefit of U.S. Provisional Application No. 62/855,129, filed on May 31, 2019, the contents of which are hereby incorporated by reference in their entirety.

BACKGROUND

A trend in the semiconductor manufacturing industry is to integrate different circuit elements, including logic, passive components such as capacitors and resistors, memory, processors, peripherals, etc., on a common semiconductor substrate. Such integration can lower manufacturing costs, simplify manufacturing procedures, and increase operational speed of the resultant circuit compared to approaches where the circuit elements are made on separate integrated circuits (ICs) and then electrically coupled to one another on a printed circuit board.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
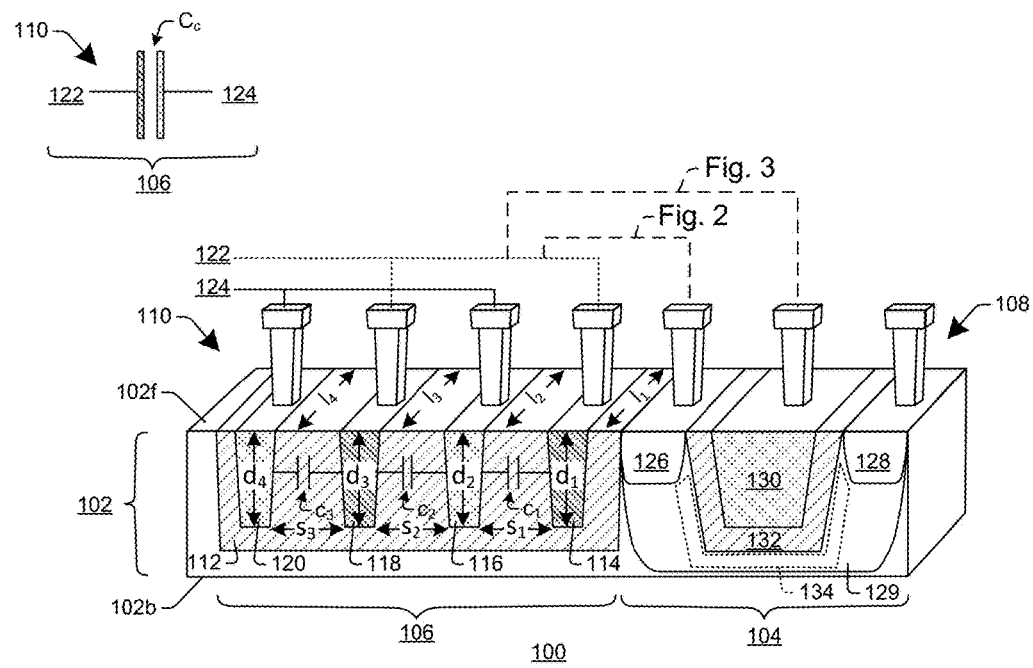
FIG. 1 illustrates a cross-sectional perspective view of an integrated circuit including a composite capacitor in accordance with some embodiments.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Transistors with high-k gate dielectrics and metal gates have been widely used in scaling down integrated circuit (IC) technology for better gate control and device performance. However, replacement-gate or gate-last processes have faced many challenges, especially as channel length are reduced and voltage biases over the transistor are increased in advanced technologies. In advanced technologies (e.g., minimum feature sizes of 28 nm and smaller), the applied voltages are being scaling down for successive generations of technology due to process limitations. However, high voltage applications have been widely used in power management, regulators, battery protectors, direct current (DC) motors, automotive components, panel display drivers (e.g., super twisted nematic (STN), thin film transistor (TFT), and/or organic light emitting diode (OLED) panel display drivers), color display drivers, power supply components, and telecom circuits, among others. When moving to advanced technology nodes, polysilicon-insulator-polysilicon (PIP) capacitors become complex to achieve. This disclosure provides recessed composite capacitors that are compatible in terms of integration with high-voltage devices.

FIG. 1 shows a cross-sectional view of some embodiments of an integrated circuit (IC) 100 in accordance with some embodiments. The IC 100 includes a semiconductor substrate 102 having a frontside 102f and backside 102b. A transistor 108 and/or other semiconductor device is arranged in and/or over a logic region 104 in the semiconductor substrate 102; and a composite capacitor 110 is arranged in and/or over a capacitor region 106 in the semiconductor substrate 102.

In some instances, the capacitor region 106 corresponds to a shallow trench isolation (STI) region filled with dielectric material 112. The capacitor region 106 includes a plurality of capacitor plates that are substantially vertical and that are disposed in dielectric material 112 of the STI region. For example, a first capacitor plate 114 and a second capacitor plate 116 are disposed in the dielectric material 112 of the shallow trench isolation region. The first capacitor plate 114 and the second capacitor plate 116 are substantially parallel to one another and are separated from one another by the dielectric material 112 of the shallow trench isolation region. Additional capacitor plates, such as a third capacitor plate 118 and a fourth capacitor plate 120 for example, may also be arranged substantially parallel to the first and second capacitor plates 114, 116, and are separated from one another by the dielectric material 112 of the shallow trench isolation region in some embodiments. Thus, the first, second, third, and/or fourth capacitor plates 114, 116, 118, 120 may be "recessed" into the substrate 102, and can be operably coupled to one another through contacts and/or an interconnect structure that includes horizontal metal lines and vertical vias over the semiconductor substrate 102.

In such a configuration, the first, second, third, and/or fourth capacitor plates 114, 116, 118, 120 can be coupled together to establish several capacitive components (e.g., $C_1$, $C_2$, $C_3$) that are arranged electrically in parallel with one another to establish the composite capacitor 110 whose total capacitance $C_c$, as measured between first and second capacitor terminals 122, 124, is a sum of capacitances of the capacitive components (e.g., $C_c=C_1+C_2+C_3$). In some embodiments, the first, second, third, and/or fourth capacitor plates 114, 116, 118, 120 have substantially parallel sidewall structures. The sidewalls may in fact be parallel or may have small offsets from being parallel (and may in fact be vertical or may have small offsets from being vertical), for example the sidewalls may have scallops due to the etching process used, or may be tapered, such that the upper portions of the sidewalls are slightly closer together than bottom portions of the sidewalls, for example.

Within the composite capacitor 110, the capacitance of each capacitive component $C_n$ (n=1, 2, 3, . . . ) is defined by the following formula:

$$c_n = \varepsilon_0 \varepsilon_r \frac{A_n}{S_n};$$

where $c_n$ is the capacitance of the nth capacitive component in farads, $\varepsilon_0$ is the permittivity of vacuum, $\varepsilon_r$ is the permittivity of the dielectric material 112 between the plates, $A_n$ is the total area between the neighboring capacitor plates, and $S_n$ is the spacing between the neighboring capacitor plates. An advantage in the arrangement of FIG. 1 is that the layout of the composite capacitor 110 can be tuned to adjust the spacings, $S_n$, between the first, second, third, and fourth capacitor plates 114, 116, 118, 120, respectively; as well as the areas, $A_n$, between neighboring capacitor plates, respectively. More particularly, the areas, $A_n$, between the capacitor plates can be adjusted based on the depths, $d_n$, that the respective capacitor plates extend into the substrate, and the lengths, $l_n$, of the respective capacitor plates.

The transistor 108 includes first and second source/drain regions 126, 128 having a first conductivity type (e.g., n-type), a well region 129 having a second conductivity type (e.g., p-type) opposite the first conductivity type, and a gate electrode 130 disposed between the first and second source/drain regions 126, 128. The gate electrode 130 extends to a gate electrode depth into the frontside of the semiconductor substrate 102, and a gate dielectric layer 132 extends to a gate dielectric depth into the frontside of the semiconductor substrate 102 to separate the gate electrode 130 from the semiconductor substrate 102. A channel region 134 is disposed in the semiconductor substrate 102 along a lower surface and outer sidewalls of the gate dielectric layer 132 and extends between the first and second source/drain regions 126, 128. Thus, the gate electrode 130 is also "recessed" in the substrate 102. In some embodiments, the material composition and depth of the gate dielectric layer 132 can correspond to that of dielectric material 112 of the STI region; and the material composition and depth of the first, second, third, and fourth capacitor plates 114, 116, 118, 120 can correspond to that of the gate electrode 130. For example, the gate dielectric layer 132 and dielectric material 112 of the STI region can be or comprise a high-k dielectric material or silicon dioxide, and can extend to a depth ranging from several nanometers to several micrometers into the semiconductor substrate 102. Further, in some embodiments the gate electrode 130 and capacitor plates 114, 116, 118, 120 can be or comprise doped polysilicon, and can have a depth ranging from several nanometers to several micrometers into the semiconductor substrate. In other embodiments, the gate electrode 130 and capacitor plates 114, 116, 118, 120 can be or comprise another conductive material, such as tungsten, aluminum, copper, or nickel for example. Further, in still other embodiments, the gate dielectric layer 132 and dielectric material 112 of the STI region can be different materials and/or different depths from one another; and/or the gate electrode 130 and first, second, third, and fourth capacitor plates 114, 116, 118, 120 can be different materials and/or different depths from one another.

Because the first, second, third, and fourth capacitor plates 114, 116, 118, 120 (which are disposed in the dielectric material 112 of the STI region) and gate electrode 130 each extend downward into the semiconductor substrate's frontside 102f, this approach offers a composite capacitor 110 that is more compatible with replacement gate processes and/or integrates better with high-voltage devices. Thus, various composite capacitor embodiments provided herein can be manufactured in an efficient manner, particularly when viewed from an integration perspective with high-voltage transistors such as in FIG. 1. Further, because the first, second, third, and fourth capacitor plates 114, 116, 118, 120 are disposed within dielectric material 112 of an STI region, this approach may provide a compact footprint and good device characteristics in many regards.

Figures 2, 3:
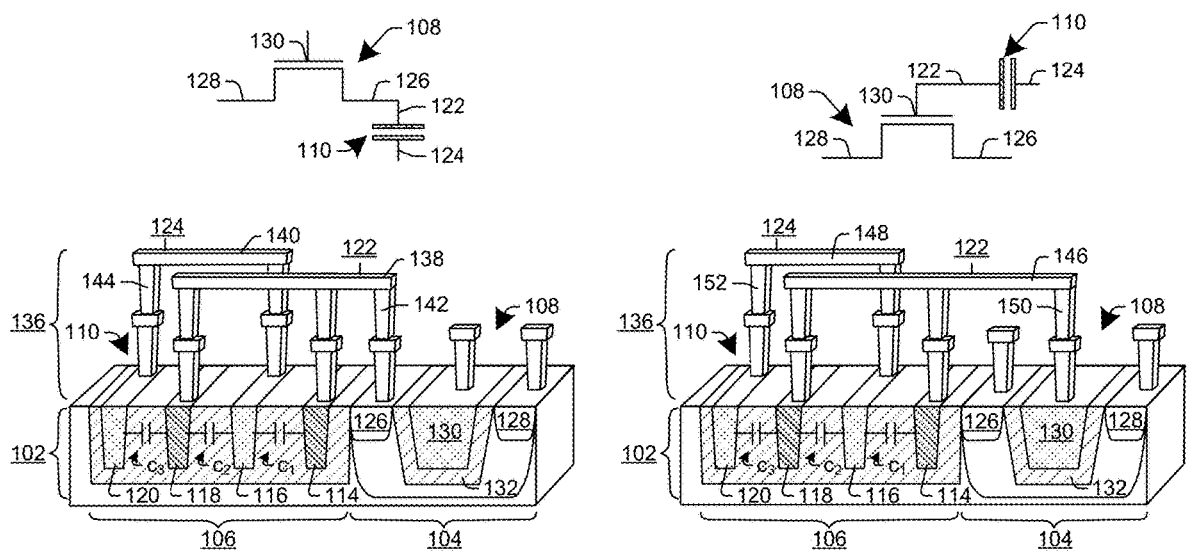
FIGS. 2-3 illustrates cross-sectional perspective views of integrated circuits showing some examples of how composite capacitors can be coupled to a logic device in accordance with some embodiments.

As can be seen from FIGS. 1-3, the composite capacitor 110 and transistor 108 can be operably coupled in several different configurations. For example, as can be seen from FIG. 2, in some embodiments a source/drain region 126 of the transistor 108 can be directly coupled to the first and/or second capacitor terminal (e.g., 122). This coupling illustrated in FIG. 2 can be achieved through an interconnect structure 136 that includes one or more metal lines 138, 140 extending horizontally over the capacitor region 106 and logic region 104, and one or more contacts or vias (e.g., 142, 144). A first capacitor terminal 122 of the composite capacitor 110 is coupled to the first and third capacitor plates 114, 118 and to the first source/drain region 126 though a first of the metal lines (e.g., 138) and one or more contacts or vias (e.g., 142); while a second capacitor terminal 124 of the composite capacitor 110 is coupled to the second and fourth capacitor plates 116, 120 though a second of the metal lines (e.g., 140) and one or more contacts or vias (e.g., 144). In other embodiments, the gate electrode 130 can be coupled directly to the first or second capacitor terminal 122, 124 of the composite capacitor 110, as can be seen from FIG. 3, for example. This coupling illustrated in FIG. 3 can be achieved through an interconnect structure 136 that includes one or more metal lines 146, 148 extending horizontally over the capacitor region 106 and logic region 104, and one or more contacts or vias (e.g., 150, 152). In FIG. 3, a first capacitor terminal 122 of the composite capacitor 110 is coupled to the first and third capacitor plates 114, 118 and gate electrode 130 through a first of the metal lines (e.g., 146) and one or more contacts or vias (e.g., 150); while a second capacitor terminal 124 of the composite capacitor 110 is coupled to the second and fourth capacitor plates 116, 120 though a second of the metal lines (e.g., 148) and one or more contacts or vias (e.g., 152). In other embodiments, the composite capacitor 110 and transistor 108 are not directly coupled to one another.

FIGS. 4-11 illustrate some examples that depict how the total capacitance $C_c$ of composite capacitors in accordance with some embodiments can be tuned by adjusting the depths, spacings, and/or lengths of the capacitor plates for the various capacitive elements. It will be appreciated that these are merely examples, and other variations are also contemplated as falling within the scope of the present disclosure.

Figure 4:
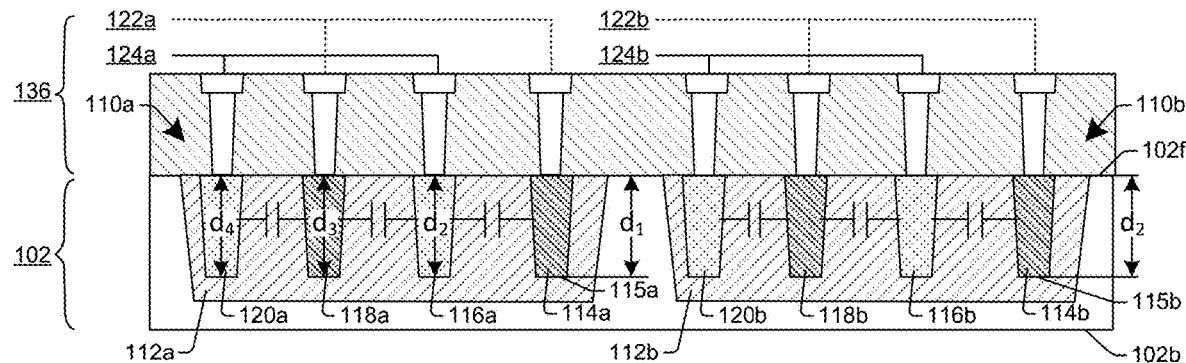
FIGS. 4-11 illustrate some examples of how depths, spacings, and/or lengths of composite capacitors can be adjusted to set the capacitance of composite capacitors in accordance with some embodiments.

FIG. 4 illustrates an embodiment that includes first and second composite capacitors 110a, 110b disposed within first and second STI regions 112a, 112b, respectively, in a semiconductor substrate 102. In this example, the first and second composite capacitors 110a, 110b each include a first capacitor plate (114a, 114b, respectively) having a first bottom surface (115a, 115b, respectively); and each include a second capacitor plate (116a, 116b, respectively). The first bottom surfaces 115a, 115b are disposed at first and second depths d1, d2, respectively, from the frontside 102f of the semiconductor substrate. The first and second depths d1, d2 are equal to one another in FIG. 4; and are also equal to depths of second bottom surfaces for the second capacitor plates 116a, 116b. The first and second composite capacitors 110a, 110b also include third capacitor plates 118a, 118b, respectively. The third capacitor plates 118a, 118b have third bottom surfaces disposed at a third depth below the frontside of the semiconductor substrate, wherein the first depth, the second depth, and the third depth are equal to one another. For example, d1 and d2 can range from several nanometers to several microns in some embodiments. FIG. 4 also shows each composite capacitor including a fourth capacitor plate 120a, 120b, at the same depth as the first, second, and third plates, though other numbers of capacitor plates are also contemplated as falling within the scope of the present disclosure. The spacings between neighboring capacitor plates are equal in the example of FIG. 4.

It will be appreciated that "first", "second", "third", "fourth", and the like, are merely generic identifiers herein and do not imply or suggest any spatial or temporal relationship between the various elements. Further, these identifiers may be interchanged with one another in various embodiments. For example, although 114a is referred to as a "first" capacitor plate with respect to FIG. 1, 114a can also be interpreted as and/or referred to as a second capacitor plate, third capacitor plate, fourth capacitor plate, etc., in some embodiments.

Figure 5:
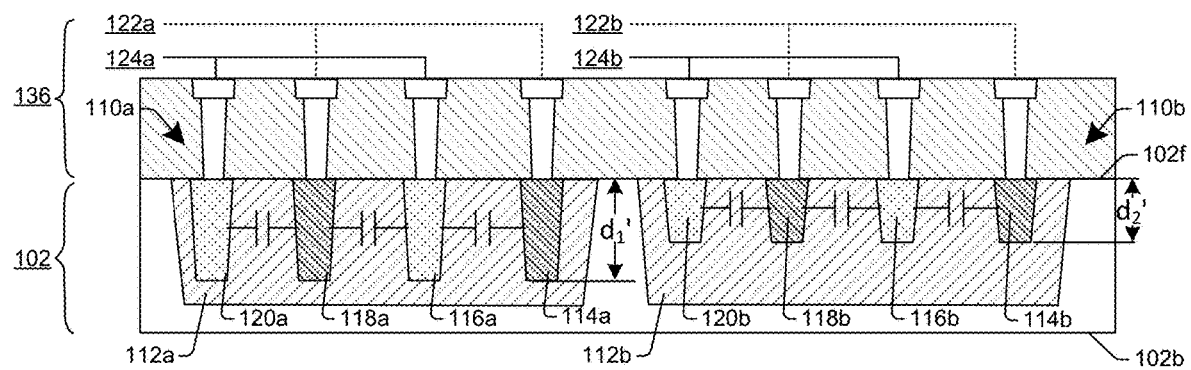

FIG. 5 illustrates another embodiment that includes first and second composite capacitors 110a, 110b disposed on a semiconductor substrate 102. In contrast to FIG. 4 (where the bottom surfaces of all the capacitor plates were at equal depths from the substrate's frontside 102f), in FIG. 5's example the capacitor plates in the first composite capacitor have first bottom surfaces at a first depth, d1', and the capacitor plates in the second composite capacitor have second bottom surfaces at a second depth, d2'. The first and second depths d1', d2' are different from one another. For example, d2 can range from 20% to 80% of d1 in some embodiments. Thus, if the length of the capacitor plates 114a-120a are equal to that of 114b-120b and spacings between the capacitor plates are also equal to that of 114b-120b, the second composite capacitor 110b in FIG. 5 can have a lower capacitance than that of the first composite capacitor 110a due to the reduced depth (and hence reduced Area, A between neighboring capacitor plates).

Figure 6:
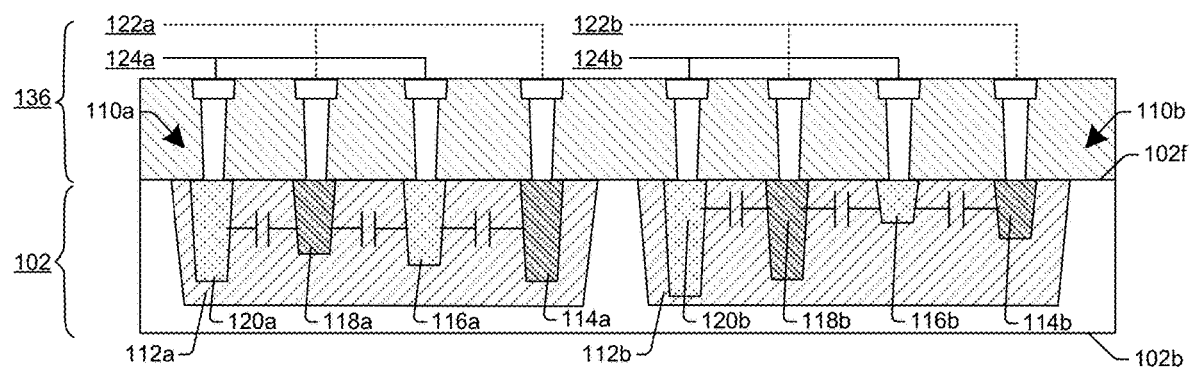

FIG. 6 illustrates still another embodiment that includes first and second composite capacitors 110a, 110b disposed on a semiconductor substrate 102. In contrast to FIG. 4 and FIG. 5 (where each composite capacitor 110a and 110b included capacitor plates whose bottom surfaces were at equal depths within that composite capacitor), the composite capacitors 110a, 110b in FIG. 6 have capacitor plates with different depths within each composite capacitor. For example, in some embodiments, a shallowest of the capacitor plates (e.g., 116b) can range from less than 1% of the thickness of the substrate 102 to up to 75% of the thickness of the substrate 102, while the deepest of the capacitor plates (e.g., 120b) can range from 1% of the thickness of the substrate 102 to 90% of the thickness of substrate 102, and can have a depth ranging from 10% larger than the shallowest plate to 10 or 20 times larger than the shallowest plate. This approach can allow finer tuning of capacitances than other approaches.

Figure 7:
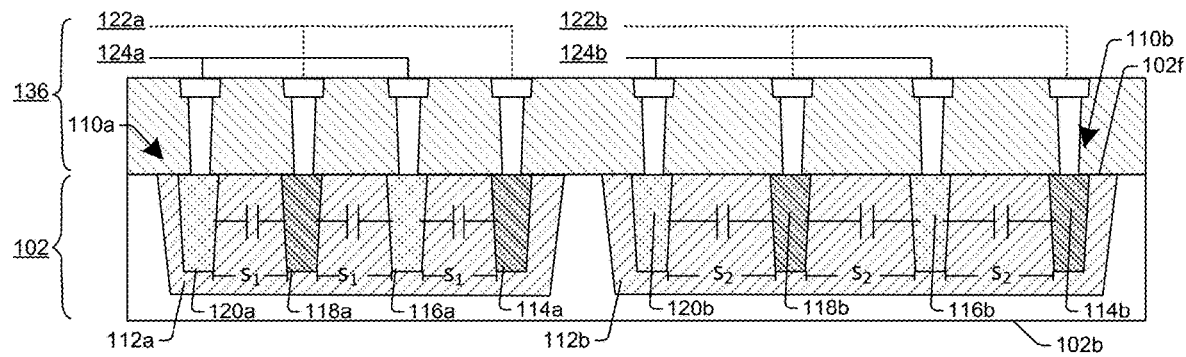

FIG. 7 illustrates still another embodiment where first and second composite capacitors 110a, 110b have capacitor plates that have the same depths, but where the first composite capacitor includes first, second, third, and fourth capacitor plates having sidewall structures that are spaced apart by a first spacing, $s_1$; and the second composite capacitor includes first, second, third, and fourth capacitor plates having sidewall structures that are spaced apart by a second spacing, $s_2$. The second spacing s2 is greater than the first spacing s1. Thus, in FIG. 7, if the length and depths of the capacitor plates 114a-120a are equal to that of 114b-120b, the second composite capacitor 110b in FIG. 5 can have a lower capacitance than that of the first composite capacitor 110a due to the increased spacing between capacitor plates.

Figure 8:
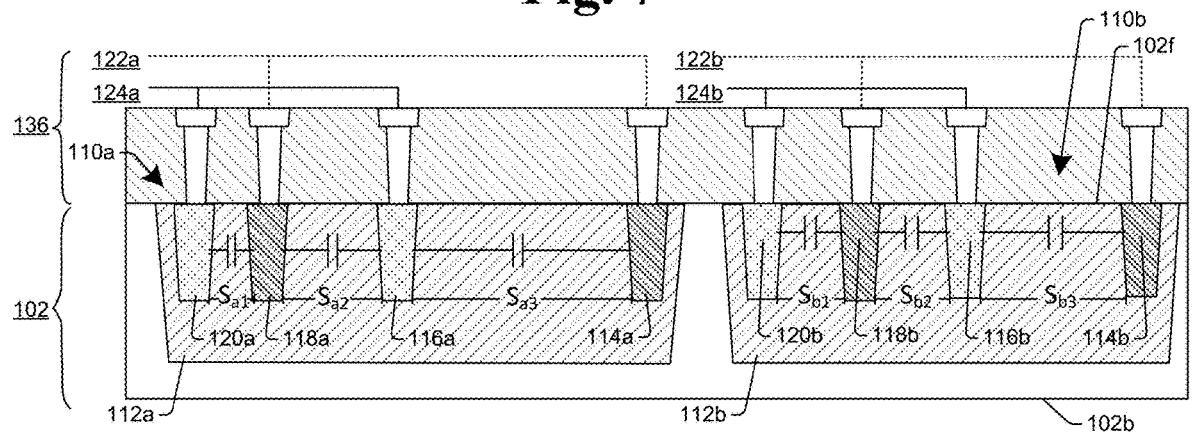

In contrast to FIG. 7 (where each composite capacitor 110a and 110b included capacitor plates that were spaced at equal spacings from neighboring capacitor plates within that composite capacitor), the composite capacitors 110a, 110b in FIG. 8 have capacitor plates with different spacing within each composite capacitor. For example, in first composite capacitor, the first and second capacitor plates are separated by a first spacing sa1, while second and third capacitor plates are separated by a second spacing sa2<sa1; and third and fourth capacitor plates are separated by third spacing sa3<sa2. For example, in second composite capacitor, the first and second capacitor plates are separated by a first spacing sb1 (e.g., sa1>sb1>sa2), while second and third capacitor plates are separated by a second spacing sb2<sb1; and third and fourth capacitor plates are separated by third spacing sb3<sb2. This approach of FIG. 8 can allow finer tuning of capacitances than other approaches, and is advantageous in that the different spacings typically do not utilize any extra photolithography steps than FIG. 7's approach.

Figure 9:
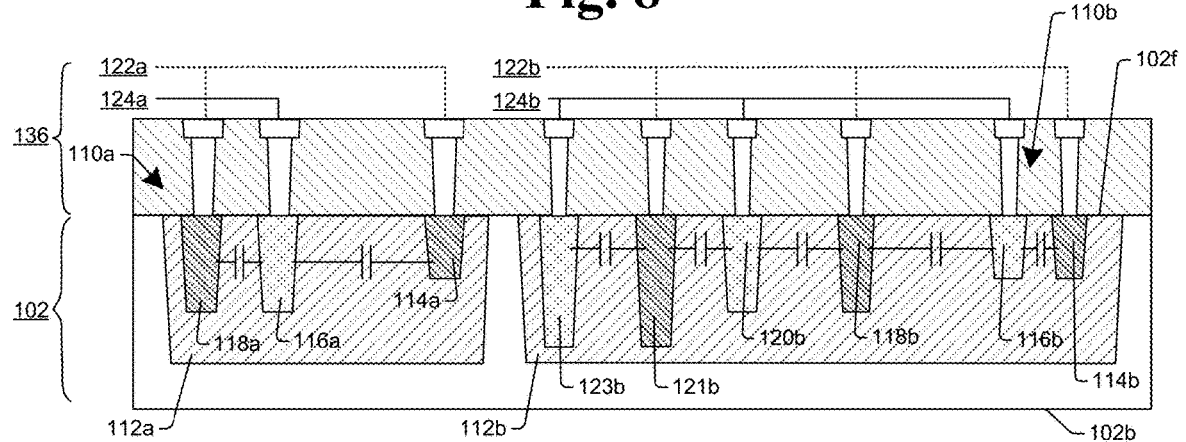

FIG. 9 illustrates still another embodiment that includes first and second composite capacitors 110a, 110b disposed on a semiconductor substrate 102. The composite capacitors 110a, 110b in FIG. 9 have capacitor plates with different depths and different spacings to neighboring capacitor plates within each composite capacitor. FIG. 9 also illustrates that the composite capacitors can have different numbers of capacitor plates to provide finer tuning of capacitances than other approaches. For example, the first composite capacitor 110a includes three capacitor plates 114a, 116a, and 118a; while the second composite capacitor 110b includes six capacitor plates 114b, 116b, 118b, 120b, 121, and 123b.

Figure 10:
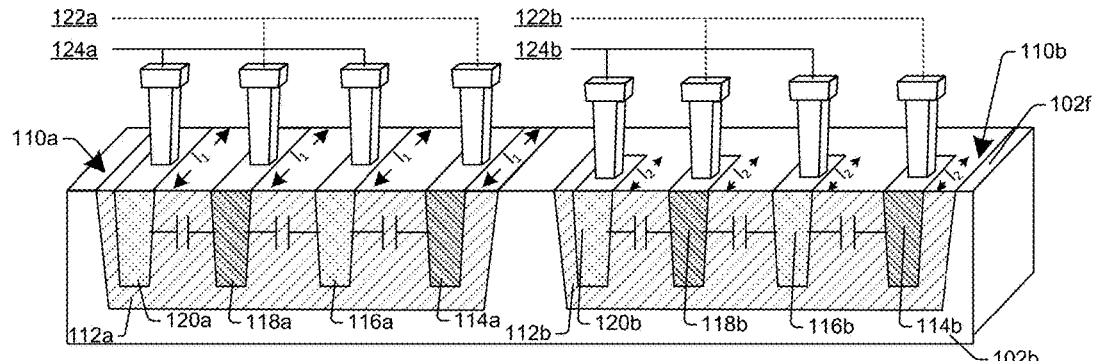
Figure 11:
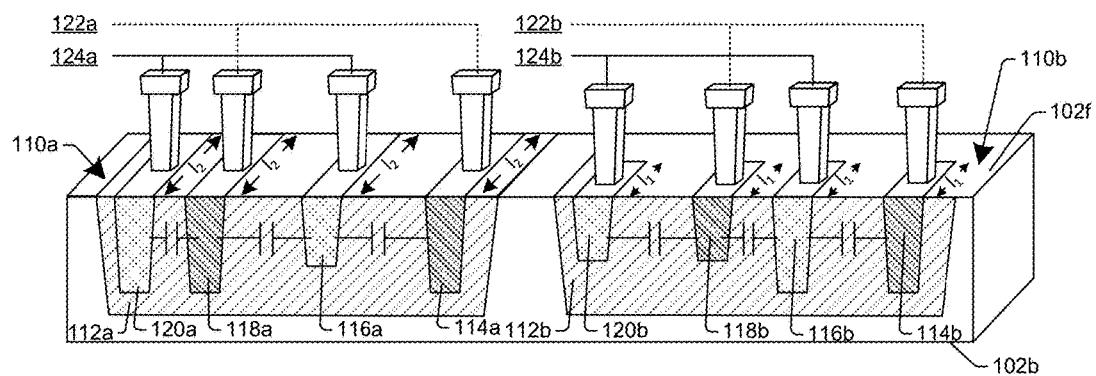

As shown in FIG. 10, the first and second composite capacitors 110a, 110b can also have different lengths from one another. For example, in first composite capacitor 110a, the first, second, third, and fourth capacitor plates each have first length 11, while in the second composite capacitor 110b, the first, second, third, and fourth capacitor plates each have second length 12. As shown in FIG. 11, the first and second composite capacitors 110a, 110b can also have different lengths, different spacings, and different depths from one another.

Figure 12:
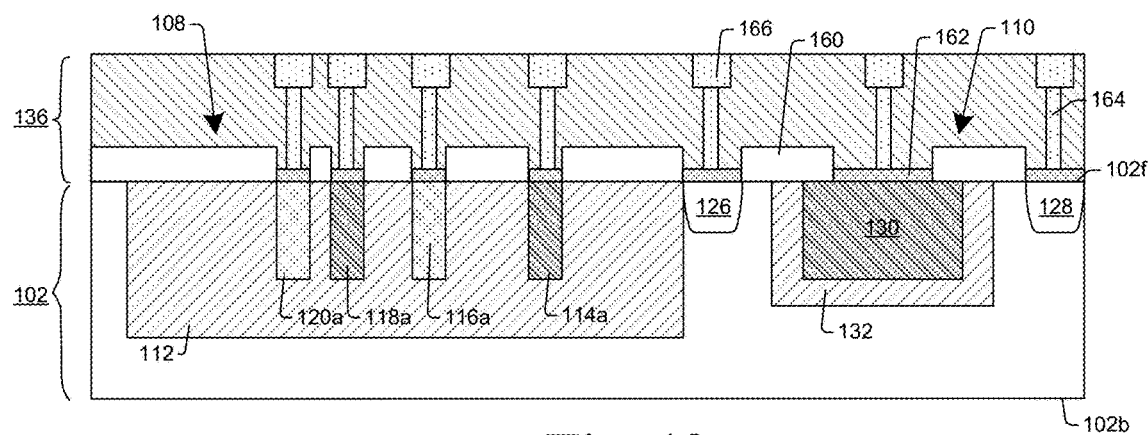
FIG. 12 illustrates a cross-sectional view of an integrated circuit including a composite capacitor in accordance with some embodiments.

FIG. 12 shows another embodiment of an integrated circuit that includes a composite capacitor 110 and a transistor 108. The composite capacitor 110 again is illustrated as having first, second, third, and fourth capacitor plates 114, 116, 118, 120 (which are disposed in the dielectric material 112 of the STI region); and the transistor 108 is again illustrated as having a gate electrode 130 and gate dielectric layer 132 which extend downward into the semiconductor substrate's frontside 102f. An etch stop layer 160, such as a silicon nitride layer, is disposed over the frontside 102f of the substrate. A silicide layer 162, such as a nickel silicide for example, extends at least partially through the etch stop layer 160 to make ohmic contact with top surfaces of the first, second, third, and fourth capacitor plates 114, 116, 118, 120, to make ohmic contact with the top surface of the gate electrode 130, and to make ohmic contact with top surfaces of the first and second source/drain regions 126, 128. Contacts 164 and/or vias, which can for example be made of tungsten or another metal, couple the silicide to lines in a metal layer 166 (e.g., metal 1 layer) of an interconnect structure over the substrate.

Figure 13:
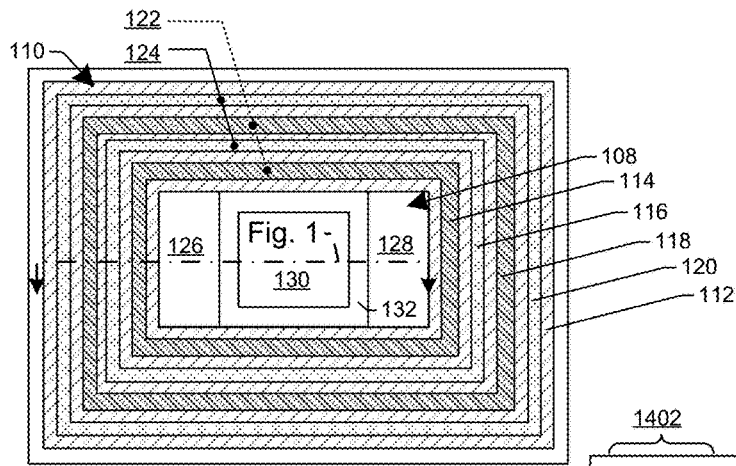
FIGS. 13-14 illustrate top views of some embodiments of an integrated circuit including a device region laterally surrounded by a shallow trench isolation region, wherein a composite capacitor is disposed in the shallow trench isolation region.
Figure 14:
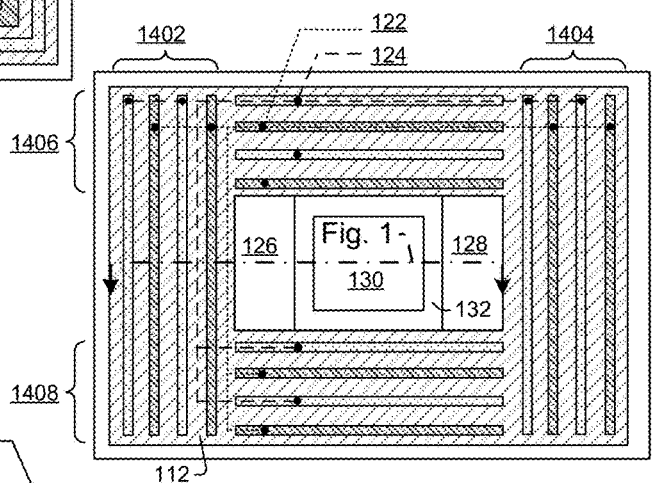

FIGS. 13-14 illustrate top views of some embodiments of an integrated circuit, such as the integrated circuit of FIG. 1, which includes a device region (which can include a transistor region 104 of FIG. 1 and/or another active and/or passive device) laterally surrounded by a shallow trench isolation region.

In FIG. 13, the device region corresponds to a transistor that includes first and second source/drain regions 126, 128, a gate electrode 130, and a gate dielectric layer 132 separating the gate electrode 130 from the underlying semiconductor substrate 102. The shallow trench isolation region laterally surrounds the device region and is filled with dielectric material 112. The shallow trench isolation region includes a plurality of capacitor plates that collectively establish a composite capacitor in the shallow trench isolation region. More particularly, in FIG. 13, the capacitor plates are concentric rings, each of which continuously and laterally surrounds the device region. Thus, the composite capacitor again is illustrated as having first, second, third, and fourth capacitor plates 114, 116, 118, 120, wherein the first and third capacitor plates are coupled to the first capacitor terminal 122, and the second and fourth capacitor plates are coupled to the second capacitor terminal to establish the composite capacitor.

In FIG. 14, the plurality of capacitor plates includes a first set of capacitor plates 1402 to a first side of the device region, a second set of capacitor plates 1404 to a second side of the device region, a third set of capacitor plates 1406 to a third side of the device region, and a fourth set of capacitor plates 1408 to a fourth side of the device region. The first and third sets of capacitor plates 1402, 1406 extend in parallel with one another in a first direction, and the second and fourth sets of capacitor plates 1404, 1408 extend in parallel with one another in a second direction, which is perpendicular to the first direction. As shown, one or more capacitor plates in each of the first, second, third, and fourth sets can be coupled to the first capacitor terminal 122, and one or more other capacitor plates in each of the first, second, third, and fourth sets can be coupled to the second capacitor terminal 124, thereby establishing a composite capacitor.

Figure 15:
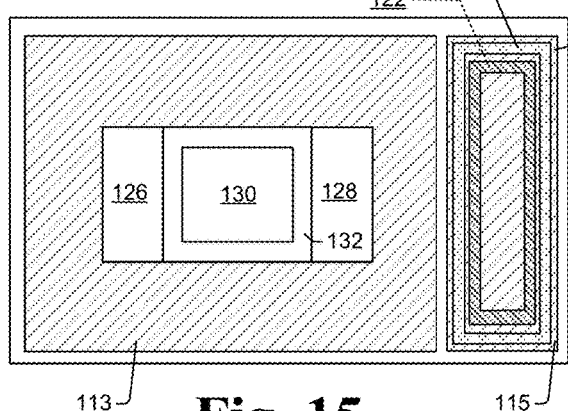
FIGS. 15-16 illustrate top views of some embodiments of an integrated circuit including a device region laterally surrounded by a first shallow trench isolation region, wherein a composite capacitor is disposed in a second shallow trench isolation region that is laterally spaced from the first shallow trench isolation region and does not surround the device region.
Figure 16:
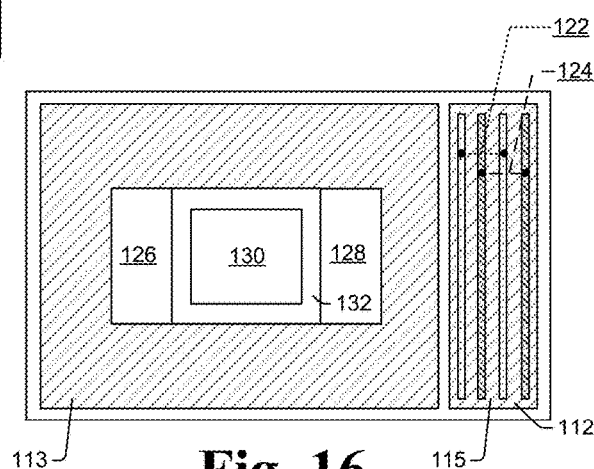

FIGS. 15-16 illustrate top views of some embodiments of an integrated circuit including a device region laterally surrounded by a first shallow trench isolation region 113 filled with dielectric material. This integrated circuit also includes a second shallow trench isolation region 115 that is isolated from the first shallow trench isolation region 113. The second shallow trench isolation region 115 is also filled with dielectric material, but does not fully surround the device region. In FIG. 15, the capacitor plates are concentric rings disposed within the second shallow trench isolation region, to establish the composite capacitor. In FIG. 16, the capacitor plates are linear segments arranged in parallel in a first direction and coupled to the first capacitor terminal 122 and second capacitor terminal 124, thereby establishing a composite capacitor.

Figure 17:
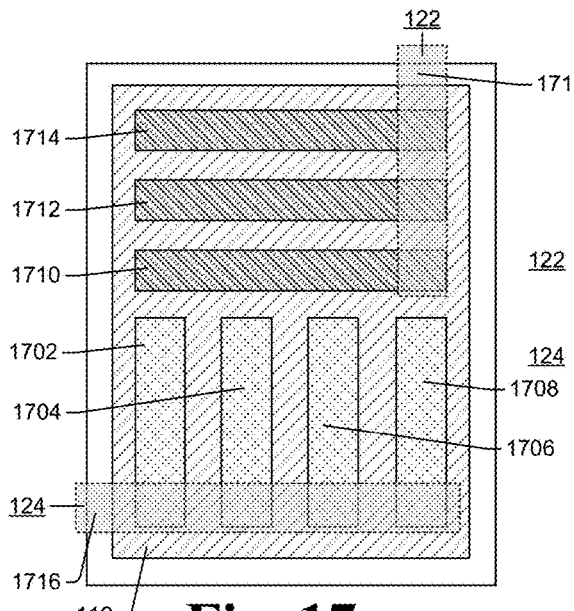
FIGS. 17-21 illustrate top views of some embodiments of an integrated circuit including a composite capacitor in accordance with some embodiments.

In FIG. 17, the composite capacitor includes a first capacitor plate 1702, a second capacitor plate 1704, a third capacitor plate 1706, and a fourth capacitor plate 1708 disposed in the shallow trench isolation region. The second capacitor plate 1704 is arranged between the first capacitor plate 1702 and the third capacitor plate 1706; and the third capacitor plate 1706 is arranged between the second capacitor plate 1704 and the fourth capacitor plate 1708. The first capacitor plate 1702, the second capacitor plate 1704, the third capacitor plate 1706, and the fourth capacitor plate 1708 extend in parallel with one another in a first direction and have equal lengths in the first direction, and have respective ends that are aligned with one another in a second direction perpendicular to the first direction. Fifth, sixth, and seventh capacitor plates 1710, 1712, 1714 extend in parallel with one another in the second direction and have equal lengths in the second direction, and have respective ends that are aligned with one another in the first direction. A first metal line 1716 couples the first, second, third, and fourth capacitor plates to one another, and a second metal line 1718 couples the first, sixth, and seventh capacitor plates to one another.

Figure 18:
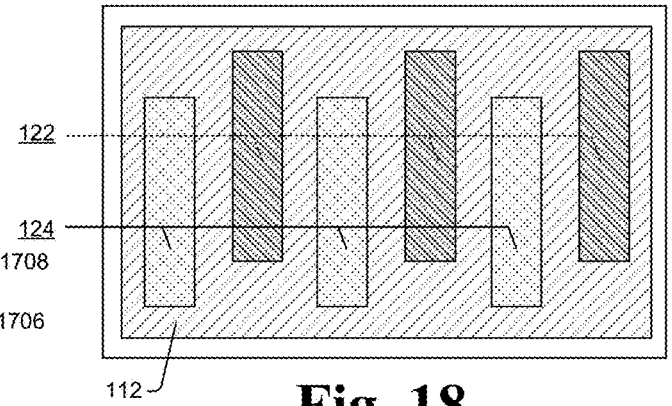

FIG. 18 illustrates another example where the capacitor plates are arranged in parallel with one another, but have respective ends that are offset or "staggered" from one another in a second direction perpendicular to the first direction.

Figure 19:
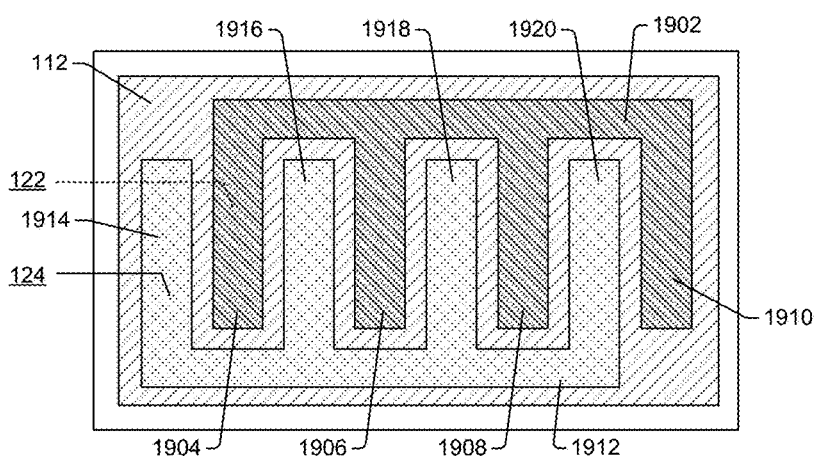

FIG. 19 illustrates still another example in accordance with some embodiments. In FIG. 19, the first capacitor plate includes a first trunk 1902 extending in a first direction, and a first plurality of fingers 1904, 1906, 1908, 1910 that extend outward from the first trunk 1902 in a second direction perpendicular to the first direction. A second capacitor plate includes a second trunk 1912 extending in the first direction but spaced apart from the first trunk 1902, and a second plurality of fingers 1914, 1916, 1918, 1920 that extend outward from the second trunk 12912 in the second direction. The first plurality of fingers are inter-digitated with the second plurality of fingers and are separated there from by the dielectric material 112 of the shallow trench isolation region. This embodiment is advantageous as it provides good matching for capacitors, and provides a relatively small footprint on the chip.

Figure 20:
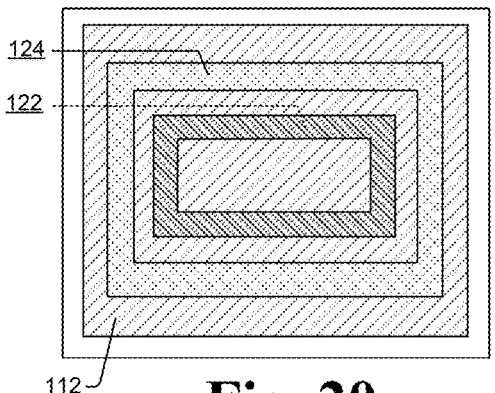
Figure 21:
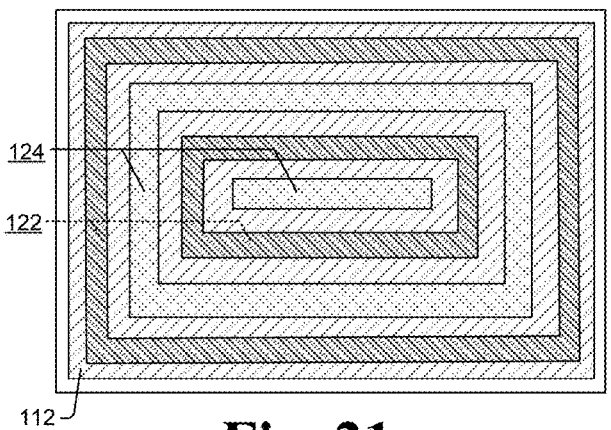

FIGS. 20-21 illustrate still further examples in accordance with some embodiments. In these figures, the first capacitor plate and second capacitor plate are concentric rings of conductive material separated from one another by the dielectric material 112 of the shallow trench isolation region.

Figure 22:
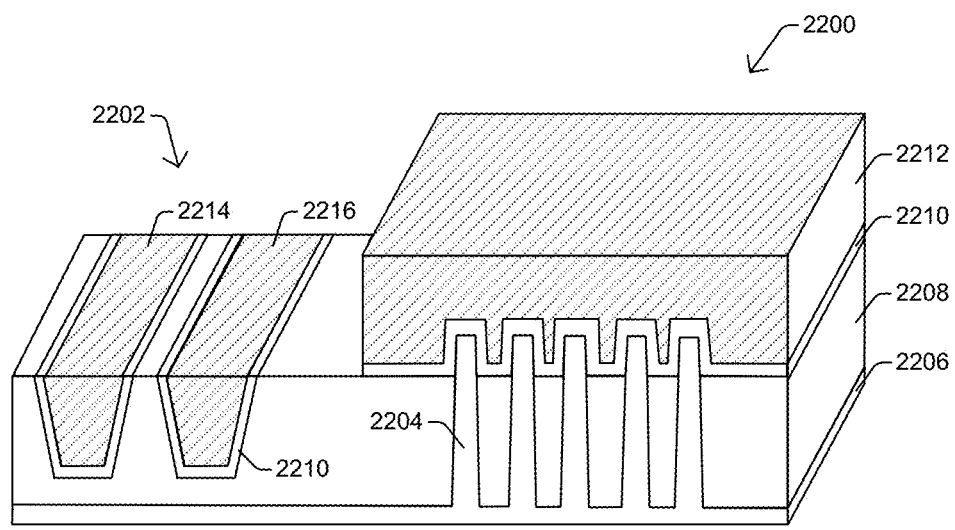
FIGS. 22-23 illustrate cross-sectional perspective views of an integrated circuit including a shallow trench isolation region including a composite capacitor and a device region including a fin field effect transistor (FinFET) device, in accordance with some embodiments.
Figure 23:
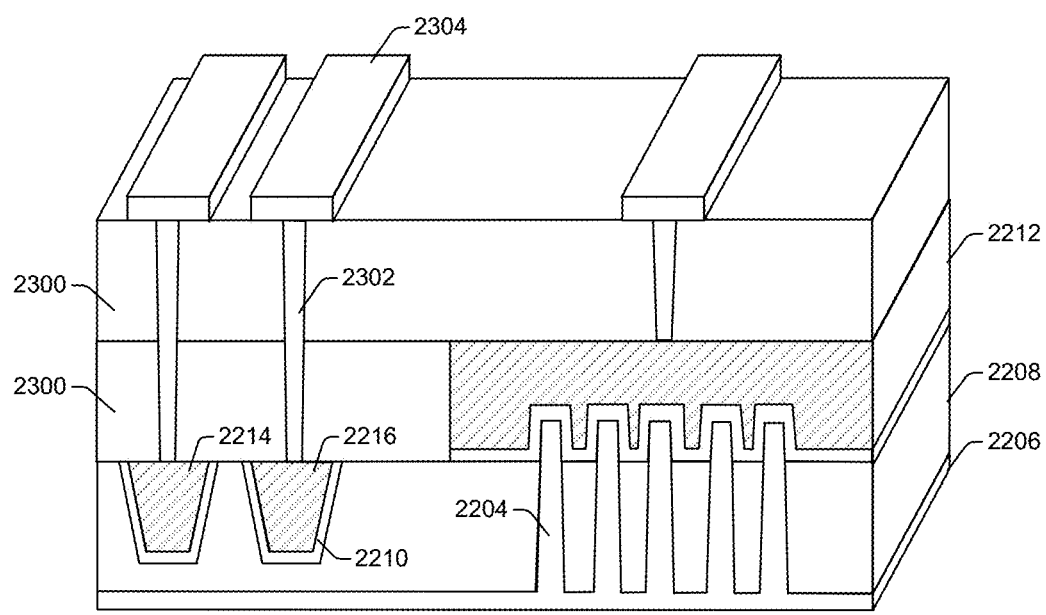

FIGS. 22-23 illustrate some additional embodiments where the transistor is implemented as a FinFET 2200 that is on the same substrate as a composite capacitor 2202. FIG. 23 illustrates the structure with an inter-layer dielectric (ILD) layer 2300, contacts 2302, and a metal layer 2304 in place, while these layers have been removed in FIG. 22 to better illustrate the underlying structure. The FinFET 2200 includes a plurality of fins 2204 of semiconductor material that extend upward from the base substrate 2206 and extend through a shallow trench isolation layer 2208 made of dielectric material, such as high-k dielectric or silicon dioxide. A gate dielectric layer 2210 extends over top surfaces and upper sidewall regions of the fins 2204, and a conductive gate electrode 2212 extends over the gate dielectric layer 2210. The conductive gate electrode 2212 can for example be made of polysilicon or metal. The composite capacitor 2202 includes first and second capacitor plates 2214, 2216 which are disposed in the shallow trench isolation layer 2208. In some instances, the gate dielectric layer 2210 separates the first and second capacitor plates 2214, 2216 from the shallow trench isolation layer 2208.

FIGS. 24-29 illustrate some embodiments of forming an integrated circuit that includes a high voltage transistor and a composite capacitor. While the disclosed methods (e.g., the method described by flowcharts, cross-sectional views, and/or other methods disclosed herein) may be illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

Figure 24:
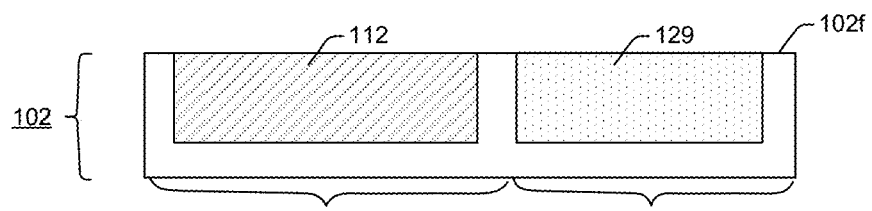
FIGS. 24-29 illustrate a series of cross-sectional views that collectively depict a method of forming an integrated circuit including a composite capacitor in a shallow trench isolation region and transistor in a logic region of a semiconductor substrate.

In FIG. 24, a semiconductor substrate 102 is provided. The substrate 102 includes a logic region 104 and a capacitor region 106. In some embodiments, the semiconductor substrate 102 can be a monocrystalline silicon substrate or a semiconductor-on-insulator (SOI) substrate (e.g., silicon on insulator substrate). The semiconductor substrate 102 can also be a binary semiconductor substrate (e.g., GaAs), a tertiary semiconductor substrate (e.g., AlGaAs), or a higher order semiconductor substrate, for example. The substrate 102 can include doped regions formed in the substrate, epitaxial layers formed on the substrate, one or more insulating layers formed in or on the substrate, and/or conducting layers formed in or on the substrate. In many instances, the semiconductor substrate 102 manifests as a semiconductor wafer during the manufacturing process, and can have a diameter of 1-inch (25 mm); 2-inch (51 mm); 3-inch (76 mm); 4-inch (100 mm); 5-inch (130 mm) or 125 mm (4.9 inch); 150 mm (5.9 inch, usually referred to as "6 inch"); 200 mm (7.9 inch, usually referred to as "8 inch"); 300 mm (11.8 inch, usually referred to as "12 inch"); 450 mm (17.7 inch, usually referred to as "18 inch"); for example. After processing is completed, for example after transistors, capacitor elements, and logic elements are formed, such a wafer can optionally be stacked with other wafers or die, and is then singulated into individual die which correspond to individual ICs. A first mask (not shown) is patterned over the frontside 102f of the semiconductor substrate 102, and a first recess is formed. A dielectric material 112, such as a high-k dielectric material or silicon dioxide, is then used to fill the first recess to establish a shallow trench isolation region. The first mask is then removed, and a second mask is formed. With the second mask in place, ions of a first conductivity type are implanted into the substrate to establish a well region 129. The first mask and/or second mask can be a hardmask layer, such as a nitride, and/or can be a photoresist layer, for example.

Figure 25:
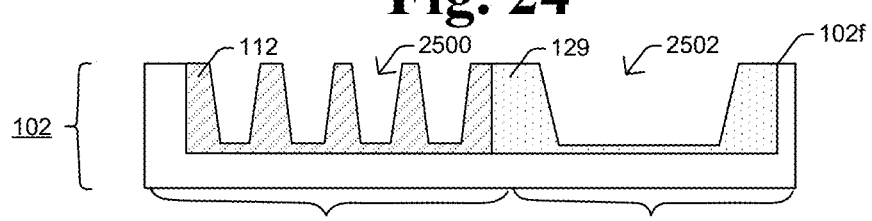

In FIG. 25, the second mask is removed, and a third mask is patterned over the frontside of the semiconductor substrate. With the third mask in place, an etch is carried out to form a gate electrode recess 2500 in the well region and a set of capacitor plate recesses 2502 in the shallow trench isolation region. The third mask can be a hardmask layer, such as a nitride, and/or can be a photoresist layer, for example.

Figure 26:
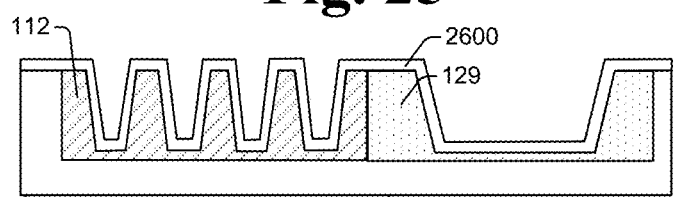

In FIG. 26, dielectric material 2600, such as a high-k dielectric material or silicon dioxide, is then formed on the surface of the set of recesses. The dielectric material 2600 can have a thickness, for example, of 200 angstroms to 1000 angstroms, and can establish a gate dielectric for the transistor.

Figure 27:
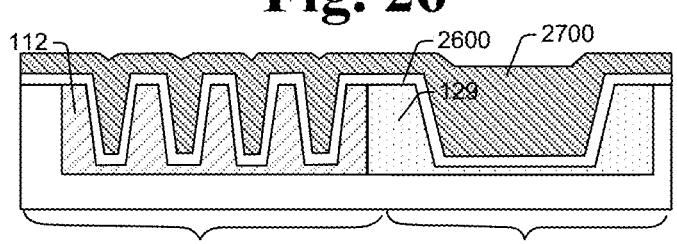

In FIG. 27, polysilicon 2700 is deposited over the dielectric material. For example, the polysilicon can be formed by chemical vapor deposition (CVD), plasma vapor deposition (PVD), or other deposition techniques.

Figure 28:
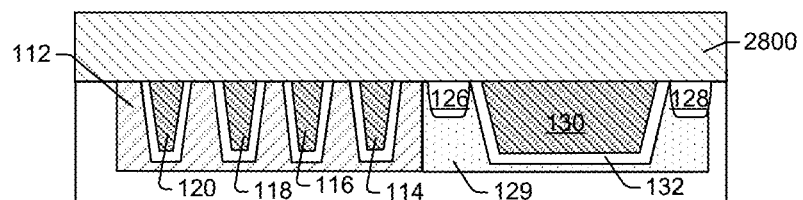

In FIG. 28, a chemical mechanical planarization (CMP) operation is carried out to planarize an upper surface of the polysilicon, dielectric material, well region, and semiconductor substrate. Another ion implantation or epitaxial growth is performed to form first and second source/drain regions 126, 128; and an interlayer dielectric (ILD) layer 2800, which is typically made of silicon dioxide or a low-k dielectric material, is then formed over the structure. Another CMP operation can then be performed to planarize an upper surface of the ILD layer 2800. Thus, a first capacitor plate 114, second capacitor plate 116, third capacitor plate 118, fourth capacitor plate 120; gate electrode 130; and gate dielectric layer 132 are formed.

Figure 29:
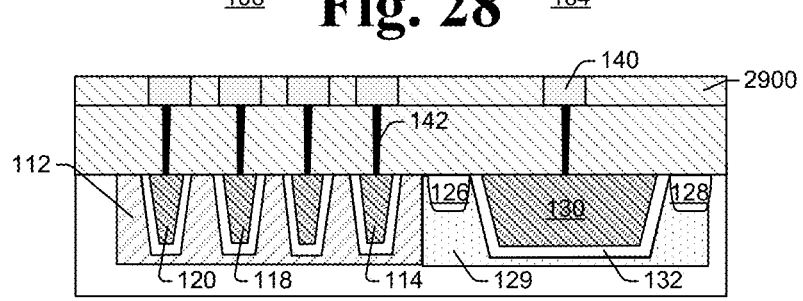

In FIG. 29, another ILD layer 2900 is formed, and contacts 142 and metal lines 140 are formed to extend through the ILD layers and to operably couple the capacitor plates to one another and/or to the transistor.

Figure 30:
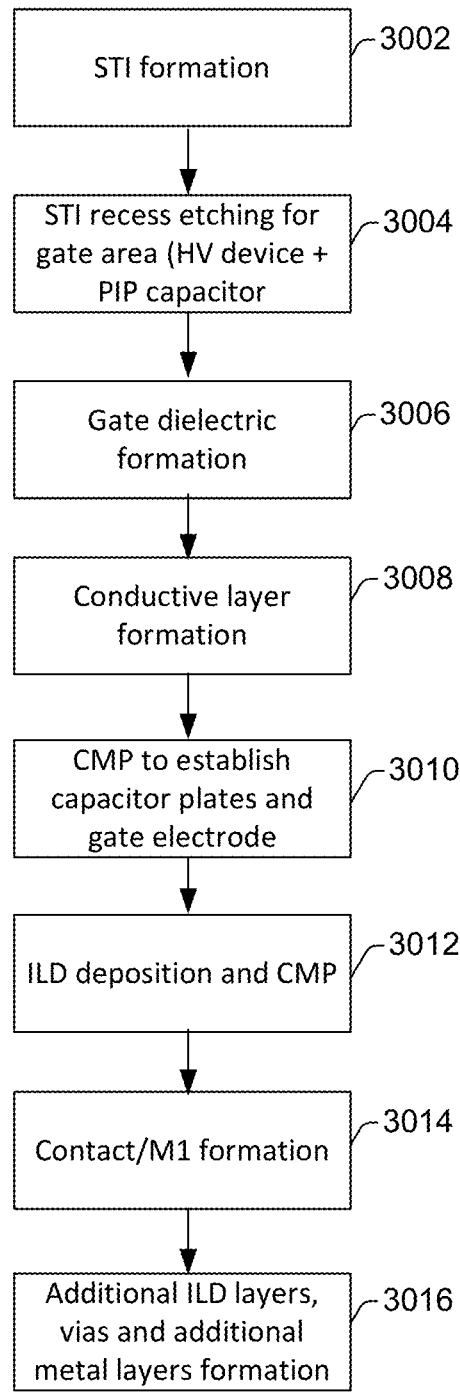
FIG. 30 illustrates a method in flow chart format for forming an integrated circuit consistent with some embodiments of FIGS. 24-29.

FIG. 30 illustrates a flowchart 3000 in accordance with some embodiments that can be consistent with some examples of FIGS. 24-29. At block 3002 an STI region made of dielectric material is formed in a capacitor region of a semiconductor substrate. Some embodiments of 3002 can correspond for example to some embodiments of FIG. 24. At block 3004 an etch is carried out to form a recess in the dielectric material of the STI region, and to concurrently form a recess in a logic region of the semiconductor substrate. Some embodiments of block 3004 can correspond for example to some embodiments of FIG. 25. At block 3006 a gate dielectric is formed in the recess in logic region of the semiconductor substrate. In some embodiments, the gate dielectric is formed by CVD or PVD and is also formed over the recess in the STI region, while in other embodiments the gate dielectric is formed by thermal oxidation and thus forms only over exposed regions of the semiconductor substrate and thus forms on the recess in the logic region but not on the dielectric material of the STI region. Some embodiments of block 3006 can correspond for example to some embodiments of FIG. 26. At block 3008 a conductive layer, such as a polysilicon layer, is formed over the gate dielectric. Some embodiments of 3008 can correspond for example to some embodiments of FIG. 27. At block 3010 a CMP operation is performed on the conductive layer to remove upper portion of the conductive layer, thereby leaving a first portion of the conductive layer in the logic region corresponding to a gate electrode, and other portion of the conductive layer in the STI region corresponding to capacitor plates. At block 3012 an ILD layer is formed over the gate electrode and capacitor plates, and a CMP is performed on the ILD. Some embodiments of blocks 3010-3012 can correspond for example to some embodiments of FIG. 28. At block 3014 contacts are formed through the ILD layer, and a metal 1 layer is formed over the contacts. Some embodiments of block 3014 can correspond for example to some embodiments of FIG. 29. At block 3016, additional ILD layers, vias, and additional metal layers are formed to establish a back-end-of-line (BEOL) interconnect structure that operably couples the capacitor plates and gate electrode.

FIGS. 31-35 illustrate another manufacturing flow as a series of perspective views in accordance with some embodiments.

Figure 31:
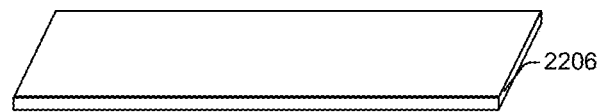
FIGS. 31-35 illustrate a series of cross-sectional views that collectively depict a method of forming an integrated circuit including a composite capacitor in a shallow trench isolation region and FinFET in a logic region of a semiconductor substrate.

In FIG. 31 a semiconductor substrate 2206 is provided.

Figure 32:
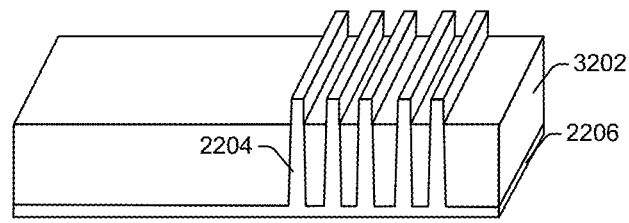

In FIG. 32, a plurality of fins 2204 are formed in or through a dielectric layer 3202, such as a high-k dielectric layer, over the substrate. In some embodiments, the fins 2204 can be formed by etching recesses into an upper surface of the substrate, and then forming dielectric material 3202 in the recesses between the fins. In other embodiments, the dielectric material 3202 can be formed as a continuous sheet over the semiconductor substrate 2206, then recesses can be formed in the dielectric material to expose upper surface regions of the substrate, and fins can be formed by epitaxially growing semiconductor material in the recesses.

Figure 33:
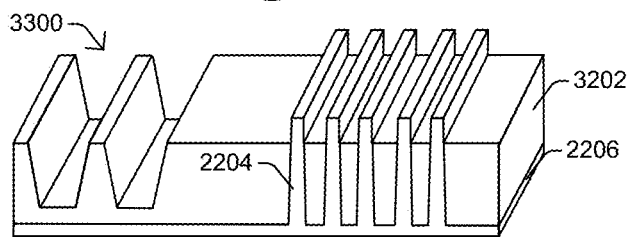

In FIG. 33, after the fins 2204 are formed, a first mask (not shown) is formed over the substrate and fins, and an etch is carried out to form recesses 3300 in the dielectric layer.

Figure 34:
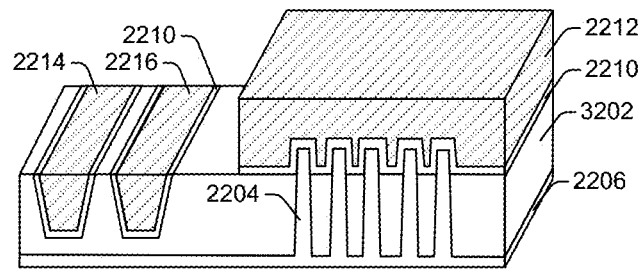

In FIG. 34, a gate dielectric layer 2210, such as a high-k gate dielectric layer is formed over a bottom surface and sidewalls of the recesses and over the dielectric layer 3202. A conductive layer, such as a doped polysilicon layer, is then formed over the gate dielectric layer 2210. A second mask (not shown) is then formed over the conductive layer over the fins, and an etch is performed with the second mask in place to remove the conductive layer from the STI region and optionally to remove part of the conductive layer in the STI region, thereby establishing gate electrode 2212 and first and second capacitor plates 2214, 2216 illustrated in FIG. 34.

Figure 35:
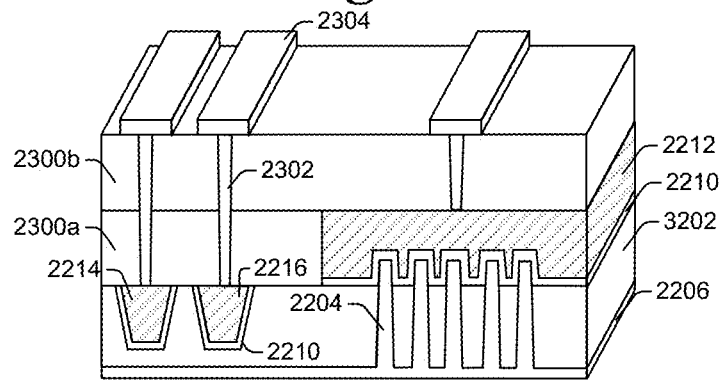

In FIG. 35, a first interlayer dielectric (ILD) layer 2300a is formed over the structure, and a CMP operation is carried out until the first ILD layer 2300a has an upper surface that is co-planar with an upper surface of the gate electrode 2212. A second ILD layer 2300b is then formed over the first ILD layer 2300a and gate electrode 2212. Contact openings are then formed through the first and second ILD layers, and metal contacts 2302, such as made of tungsten or aluminum for example, are formed in the contact openings. A first layer of metal lines 2304 (e.g., metal 1 lines), are then formed over the contacts.

Figure 36:
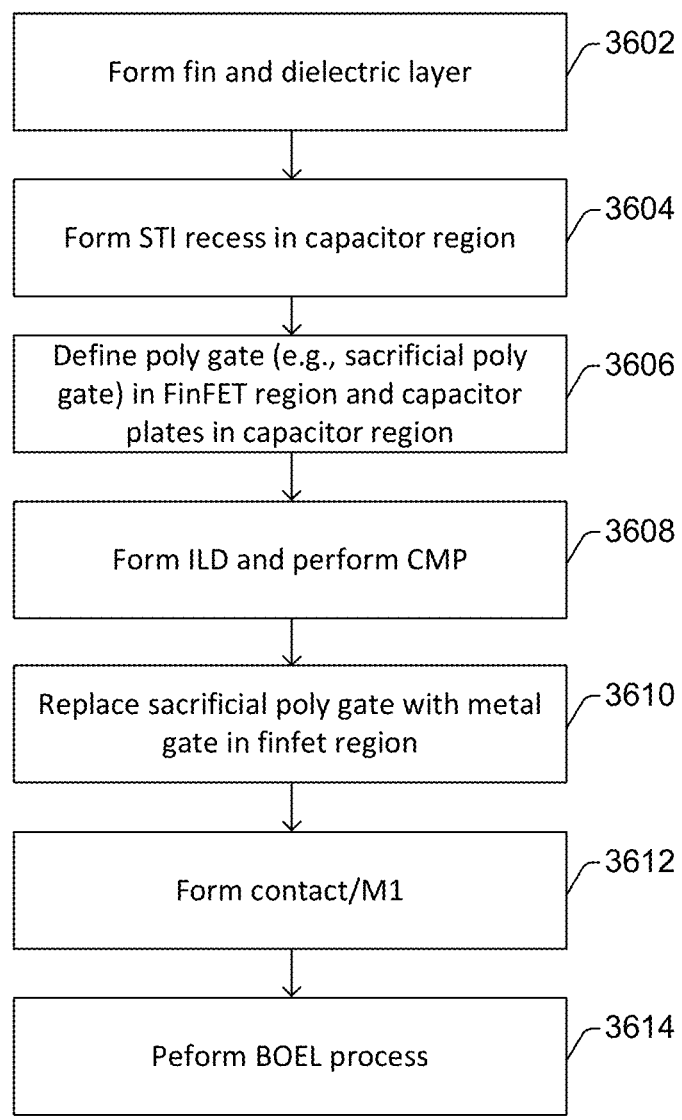
FIG. 36 illustrates a method in flow chart format for forming an integrated circuit consistent with some embodiments of FIGS. 31-35.

FIG. 36 illustrates a flowchart 3600 in accordance with some embodiments that can be consistent with some examples of FIGS. 31-35. At block 3602 fins which extends through a dielectric layer are formed over a semiconductor substrate. Some embodiments of block 3602 can correspond for example to some embodiments of FIG. 32. At block 3604 an etch is carried out to form a recess in a portion of the dielectric layer. Some embodiments of block 3604 can correspond for example to some embodiments of FIG. 33. At block 3606 a gate dielectric is formed over the structure, and a sacrificial and/or conductive layer is formed over the structure. In some embodiments, block 3606 can correspond for example to some embodiments of FIG. 34. At block 3608 an ILD layer is formed over the gate electrode and capacitor plates, and a CMP is performed on the ILD. Some embodiments of block 3608 can correspond for example to some embodiments of FIG. 34. At block 3610, which is optional, the conductive and/or sacrificial material of the gate electrode and/or optionally the capacitor plates are removed and replaced with a metal. At block 3612, contacts are formed through the ILD layer, and a metal 1 layer is formed over the contacts. Some embodiments of block 3612 can correspond for example to some embodiments of FIG. 35. At block 3614, additional ILD layers, vias, and additional metal layers are formed to establish a back-end-of-line (BEOL) interconnect structure that operably couples the capacitor plates and gate electrode.

It will be appreciated that identifiers such as "first" and "second" do not imply any type of ordering, placement, or temporal relationship with respect to other elements; but rather "first" and "second" and other similar identifiers are just generic identifiers and these elements can be swapped in other implementations. For example, "a first dielectric layer" described in connection with a first figure may not necessarily corresponding to a "first dielectric layer" described in connection with another figure or un-illustrated embodiment.

In some embodiments, an integrated circuit (IC) includes a semiconductor substrate having a frontside and a backside; a shallow trench isolation region that extends into the frontside of the semiconductor substrate and is filled with dielectric material; a first capacitor plate and a second capacitor plate that extend into the shallow trench isolation region from the frontside of the semiconductor substrate; the first capacitor plate and the second capacitor plate have first and second sidewall structures, respectively, that are substantially parallel to one another and that are separated from one another by the dielectric material of the shallow trench isolation region. In some embodiments, the first and second capacitor plates have first and second bottom surfaces, and the first and second bottom surfaces are disposed at first and second depths, respectively, from the frontside of the semiconductor substrate; the first and second depths being equal to one another. In some embodiments, the IC includes a third capacitor plate disposed in the shallow trench isolation region, wherein the third capacitor plate has a third bottom surface disposed at a third depth below the frontside of the semiconductor substrate, and wherein the first depth, the second depth, and the third depth are equal to one another or wherein the third depth is different from the first depth and the second depth. In some embodiments, the first and second capacitor plates have first and second bottom surfaces, and the first and second bottom surfaces are disposed at first and second depths, respectively, from the frontside of the semiconductor substrate, the first and second depths being different from one another. In some embodiments, the IC includes a third capacitor plate disposed in the shallow trench isolation region, wherein the third capacitor plate has a third bottom surface disposed at a third depth below the frontside of the semiconductor substrate, wherein the first depth, the second depth, and the third depth are each different from one another. In some embodiments, the IC includes a third capacitor plate disposed in the shallow trench isolation region, wherein the first and second capacitor plates are spaced apart from one another by a first distance, and the second and third capacitor plates are spaced apart by a second distance that is equal to the first distance. In some embodiments, the IC includes a third capacitor plate disposed in the shallow trench isolation region, wherein the first and second capacitor plates are spaced apart from one another by a first distance, and the second and third capacitor plates are spaced apart by a second distance that differs from the first distance. In some embodiments, the IC includes a third capacitor plate disposed in the shallow trench isolation region; and a metal line extending horizontally over at least two of the first, second, and third capacitor plates and directly coupling the at least two of the first, second, and third capacitor plates to one another. In some embodiments, the IC includes: a third capacitor plate disposed in the shallow trench isolation region, wherein the second capacitor plate is arranged between the first capacitor plate and the third capacitor plate; and a fourth capacitor plate disposed in the shallow trench isolation region, wherein the third capacitor plate is arranged between the second capacitor plate and the fourth capacitor plate; and wherein the first capacitor plate, the second capacitor plate, the third capacitor plate, and the fourth capacitor plate extend in parallel with one another in a first direction and have equal lengths in the first direction, and have respective ends that are aligned with one another in a second direction perpendicular to the first direction. In some embodiments, the IC includes: a third capacitor plate disposed in the shallow trench isolation region, wherein the second capacitor plate is arranged between the first capacitor plate and the third capacitor plate; and a fourth capacitor plate disposed in the shallow trench isolation region, wherein the third capacitor plate is arranged between the second capacitor plate and the fourth capacitor plate; wherein the first capacitor plate, the second capacitor plate, the third capacitor plate, and the fourth capacitor plate extend in parallel with one another in a first direction and have equal lengths in the first direction, and have respective ends that are offset from one another in a second direction perpendicular to the first direction. In some embodiments, the first capacitor plate includes a first trunk extending in a first direction, and a first plurality of fingers that extend outward from the first trunk in a second direction perpendicular to the first direction. In some embodiments, the second capacitor plate includes a second trunk extending in the first direction but spaced apart from the first trunk, and a second plurality of fingers that extend outward from the second trunk in the second direction, wherein the first plurality of fingers are inter-digitated with the second plurality of fingers and are separated there from by the dielectric material of the shallow trench isolation region. In some embodiments, the first capacitor plate and the second capacitor plate are concentric rings of conductive material separated from one another by the dielectric material of the shallow trench isolation region. In some embodiments, the IC includes a transistor laterally surrounded by the shallow trench isolation region, the transistor comprising: first and second source/drain regions disposed in the frontside of the semiconductor substrate; a gate electrode extending to a first non-zero depth into the frontside of the semiconductor substrate and disposed between the first and second source/drain regions; and a gate dielectric layer extending into the frontside of the semiconductor substrate to separate the gate electrode from the semiconductor substrate, wherein a channel region in the semiconductor substrate along a lower surface and outer sidewalls of the gate dielectric layer extends between the first and second source/drain regions. In some embodiments, the first non-zero depth is equal to a first depth corresponding to a bottom surface of the first capacitor plate. In some embodiments, the IC includes a transistor to a side of the shallow trench isolation region, the transistor comprising: first and second source/drain regions disposed in the frontside of the semiconductor substrate; a gate electrode extending to a first non-zero depth into the frontside of the semiconductor substrate and disposed between the first and second source/drain regions; and a gate dielectric layer extending into the frontside of the semiconductor substrate to separate the gate electrode from the semiconductor substrate, wherein a channel region in the semiconductor substrate along a lower surface and outer sidewalls of the gate dielectric layer extends between the first and second source/drain regions; and wherein the shallow trench isolation region has an outer perimeter that is distinct from and spaced apart from an outer perimeter of the first and second source/drain regions and is disposed to one side of the gate electrode without laterally surrounding the gate electrode.

In some embodiments, an integrated circuit (IC) includes: a semiconductor substrate having a frontside and a backside; first and second source/drain regions extending into the frontside of the semiconductor substrate, the first and second source/drain regions being separated from one another by a channel region in the semiconductor substrate; a gate electrode extending into the frontside of the semiconductor substrate and disposed over the channel region; a gate dielectric layer extending into the frontside of the semiconductor substrate to separate a bottom surface and outer sidewalls of the gate electrode from the channel region; a shallow trench isolation region extending into the frontside of the semiconductor substrate and arranged alongside an outer edge of the first source/drain region or the second source/drain region, the shallow trench isolation region filled with dielectric material; and a composite capacitor including a first capacitor terminal and a second capacitor terminal between which a total capacitance of the composite capacitor is defined, the composite capacitor including a plurality of substantially vertical capacitor plates that extend into the shallow trench isolation region and that are separated from one another by the dielectric material of the shallow trench isolation region, wherein a first capacitor plate of the plurality of substantially vertical capacitor plates corresponds to the first capacitor terminal of the composite capacitor and is arranged between second and third capacitor plates of the plurality of substantially vertical capacitor plates, the second and third capacitor plates being on opposite sides of the first capacitor plate and corresponding to the second capacitor terminal of the composite capacitor.

In some embodiments, a method comprises: receiving a semiconductor substrate, which includes a logic region and a capacitor region; performing a first etch to form a shallow trench isolation recess in the capacitor region; forming a dielectric material in the shallow trench isolation recess to form a shallow trench isolation region; performing a second etch to form a gate electrode recess in the logic region and a plurality of capacitor plate recesses in the shallow trench isolation region; forming a high-k dielectric material in the gate electrode recess and in the plurality of capacitor plate recesses; and forming a conductive layer concurrently in the gate electrode recess and in the plurality of capacitor plate recesses to establish a gate electrode in the logic region and a plurality of capacitor plates in the capacitor region. In some embodiments, the method includes: performing a chemical mechanical planarization (CMP) process to remove an upper portion of the conductive layer, thereby segmenting the gate electrode and the plurality of capacitor plates to be separate structures from one another. In some embodiments, the method includes: forming a dielectric structure over a planarized upper surface of the gate electrode and over planarized upper surfaces of the plurality of capacitor plates; and forming a metal interconnect structure in or over the dielectric structure, wherein the metal interconnect structure couples a first group of the plurality of capacitor plates together to establish a first capacitor terminal and couples a second group of the plurality of capacitor plates together to establish a second capacitor terminal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC), comprising:
a semiconductor substrate having a frontside and a backside;
a shallow trench isolation region extending into the frontside of the semiconductor substrate and filled with dielectric material;
a first capacitor plate and a second capacitor plate extending into the shallow trench isolation region from the frontside of the semiconductor substrate, the first capacitor plate and the second capacitor plate having first and second sidewall structures, respectively, that are substantially parallel to one another and that are separated from one another by the dielectric material of the shallow trench isolation region, wherein the first and second capacitor plates have first and second bottom surfaces, and the first and second bottom surfaces are disposed at first and second depths, respectively, from the frontside of the semiconductor substrate, the first and second depths being equal to one another; and
a third capacitor plate disposed in the shallow trench isolation region, wherein the third capacitor plate has a third bottom surface disposed at a third depth below the frontside of the semiconductor substrate, wherein the first depth, the second depth, and the third depth are equal to one another or wherein the third depth is different from the first depth and the second depth.

2. The IC of claim 1,
wherein the first and second capacitor plates are spaced apart from one another by a first distance, and the second and third capacitor plates are spaced apart by a second distance that is equal to the first distance.

3. The IC of claim 1,
wherein the first and second capacitor plates are spaced apart from one another by a first distance, and the second and third capacitor plates are spaced apart by a second distance that differs from the first distance.

4. The IC of claim 1, further comprising:
a metal line extending horizontally over at least two of the first, second, and third capacitor plates and directly coupling the at least two of the first, second, and third capacitor plates to one another.

5. The IC of claim 1,
wherein the second capacitor plate is arranged between the first capacitor plate and the third capacitor plate and further comprising:
a fourth capacitor plate disposed in the shallow trench isolation region, wherein the third capacitor plate is arranged between the second capacitor plate and the fourth capacitor plate; and
wherein the first capacitor plate, the second capacitor plate, the third capacitor plate, and the fourth capacitor plate extend in parallel with one another in a first direction and have unequal lengths in the first direction.

6. The IC of claim 5, wherein the first and third capacitor plates are conductively coupled to one another to form a first set of capacitor plates, and the second and fourth capacitor plates are conductively coupled to one another to form a second set of capacitor plates.

7. The IC of claim 5, wherein the first direction is measured along the frontside of the semiconductor substrate.

8. The IC of claim 1,
wherein the second capacitor plate is arranged between the first capacitor plate and the third capacitor plate and further comprising:
a fourth capacitor plate disposed in the shallow trench isolation region, wherein the third capacitor plate is arranged between the second capacitor plate and the fourth capacitor plate; and
wherein the first capacitor plate, the second capacitor plate, the third capacitor plate, and the fourth capacitor plate extend in parallel with one another in a first direction and have equal lengths in the first direction, and have respective ends that are offset from one another in a second direction perpendicular to the first direction.

9. The IC of claim 1, wherein the first capacitor plate and the second capacitor plate are concentric rings of conductive material separated from one another by the dielectric material of the shallow trench isolation region.

10. The IC of claim 1, further comprising a transistor laterally surrounded by the shallow trench isolation region, the transistor comprising:
first and second source/drain regions disposed in the frontside of the semiconductor substrate;
a gate electrode extending to a first non-zero depth into the frontside of the semiconductor substrate and disposed between the first and second source/drain regions; and
a gate dielectric layer extending into the frontside of the semiconductor substrate to separate the gate electrode from the semiconductor substrate, wherein a channel region in the semiconductor substrate along a lower surface and outer sidewalls of the gate dielectric layer extends between the first and second source/drain regions.

11. The IC of claim 10, wherein the first non-zero depth is equal to the first depth.

12. The IC of claim 10, wherein a set of straight capacitive plates comprising the first capacitor plate, the second capacitor plate and the third capacitor plate are positioned on a first side of the transistor, and wherein the set of straight capacitive plates are separated from one another by the dielectric material.

13. The IC of claim 1, further comprising a transistor to a side of the shallow trench isolation region, the transistor comprising:
    first and second source/drain regions disposed in the frontside of the semiconductor substrate;
    a gate electrode extending to a first non-zero depth into the frontside of the semiconductor substrate and disposed between the first and second source/drain regions; and
    a gate dielectric layer extending into the frontside of the semiconductor substrate to separate the gate electrode from the semiconductor substrate, wherein a channel region in the semiconductor substrate along a lower surface and outer sidewalls of the gate dielectric layer extends between the first and second source/drain regions; and
    wherein the shallow trench isolation region has an outer perimeter that is distinct from and spaced apart from outer perimeters of the first and second source/drain regions and is disposed to one side of the gate electrode without laterally surrounding the gate electrode.

14. The IC of claim 13, wherein the first capacitor plate forms a first ring shape within the shallow trench isolation region, and the second capacitor plate forms a second ring shape that is concentric with the first ring shape within the shallow trench isolation region, and wherein the transistor is to the side of the first and second capacitor plates.

15. The IC of claim 1, wherein the semiconductor substrate, dielectric material, first capacitor plate, and second capacitor plate have a shared flat surface.

16. An integrated circuit (IC), comprising:
    a semiconductor substrate having a frontside and a backside;
    a shallow trench isolation region extending into the frontside of the semiconductor substrate and filled with dielectric material; and
    a first capacitor plate and a second capacitor plate extending into the shallow trench isolation region from the frontside of the semiconductor substrate, the first capacitor plate and the second capacitor plate having first and second sidewall structures, respectively, that are substantially parallel to one another and that are separated from one another by the dielectric material of the shallow trench isolation region, wherein the first and second capacitor plates have first and second bottom surfaces, and the first and second bottom surfaces are disposed at first and second depths, respectively, from the frontside of the semiconductor substrate, the first and second depths being different from one another.

17. The IC of claim 16, further comprising:
    a third capacitor plate disposed in the shallow trench isolation region, wherein the third capacitor plate has a third bottom surface disposed at a third depth below the frontside of the semiconductor substrate, wherein the first depth, the second depth, and the third depth are each different from one another.

18. The IC of claim 16, wherein the first and second capacitor plates have first and second lengths, respectively, measured along the frontside of the semiconductor substrate, the first and second lengths being different from one another.

19. An integrated circuit (IC), comprising:
    a semiconductor substrate having a frontside and a backside;
    a shallow trench isolation region extending into the frontside of the semiconductor substrate and filled with dielectric material; and
    a first capacitor plate and a second capacitor plate extending into the shallow trench isolation region from the frontside of the semiconductor substrate, the first capacitor plate and the second capacitor plate having first and second sidewall structures, respectively, that are substantially parallel to one another and that are separated from one another by the dielectric material of the shallow trench isolation region, wherein the first capacitor plate includes a first trunk extending in a first direction, and a first plurality of fingers that extend outward from the first trunk in a second direction perpendicular to the first direction.

20. The IC of claim 19, wherein the second capacitor plate includes a second trunk extending in the first direction but spaced apart from the first trunk, and a second plurality of fingers that extend outward from the second trunk in the second direction, wherein the first plurality of fingers are inter-digitated with the second plurality of fingers and are separated there from by the dielectric material of the shallow trench isolation region.

* * * * *